United States Patent
Hino

(10) Patent No.: US 8,067,798 B2
(45) Date of Patent: Nov. 29, 2011

(54) SEMICONDUCTOR DEVICE

(75) Inventor: Masaki Hino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 117 days.

(21) Appl. No.: 12/385,047

(22) Filed: Mar. 30, 2009

(65) Prior Publication Data

US 2009/0242976 A1    Oct. 1, 2009

(30) Foreign Application Priority Data

Mar. 31, 2008  (JP) ................. 2008-092676
Mar. 31, 2008  (JP) ................. 2008-092677

(51) Int. Cl.
*H01L 29/66* (2006.01)
(52) U.S. Cl. ............... 257/330; 257/E29.262
(58) Field of Classification Search ........ 257/330, 257/341, E29.257, E29.262
See application file for complete search history.

(56) References Cited

U.S. PATENT DOCUMENTS

| 7,075,147 B2 * | 7/2006 | Cao ................. 257/331 |
| 7,629,634 B2 * | 12/2009 | Hsieh ............... 257/288 |
| 2006/0157779 A1 | 7/2006 | Kachi et al. |

FOREIGN PATENT DOCUMENTS

JP    2006-202931    8/2006

* cited by examiner

*Primary Examiner* — Mark Prenty
(74) *Attorney, Agent, or Firm* — Rabin & Berdo, PC

(57) ABSTRACT

The semiconductor device of the present invention includes a first conductive type semiconductor layer; a second conductive type source region formed in a surface layer portion of the semiconductor layer; a groove formed by digging in the source region from a surface thereof; an insulating film laminated on the semiconductor layer to cover a surface of the semiconductor layer; a contact hole penetrating through the insulating film in a layer thickness direction at least at a position facing the groove; a wiring formed on the insulating film; and a contact plug embedded in the contact hole so that a bottom portion thereof enters the groove to electrically connect the wiring and the source.

12 Claims, 10 Drawing Sheets

SEMICONDUCTOR DEVICE

BACKGROUND OF THE INVENTION

1. Field of the Invention

This invention relates to a semiconductor device that includes field-effect transistors.

2. Description of Related Art

For example, a trench-gate type VDMOSFET (Vertical Double diffused Metal Oxide Semiconductor Field Effect Transistor) is known as a power MOSFET that has low on-resistance properties.

FIG. 8 is a schematic sectional view of a semiconductor device that includes conventional trench-gate type VDMOSFETs.

The semiconductor device 101 has an N+type substrate 102. An epitaxial layer 103 is laminated on the substrate 102. A base layer portion of the epitaxial layer 103 serves as an N−type low-concentrated drain region 104. A surface layer portion of the epitaxial layer 103 is formed as a P type body region 105 contiguous to the low-concentrated drain region 104.

The epitaxial layer 103 has a plurality of gate trenches 106 formed by digging in from the surface of the epitaxial layer 103. The gate trenches 106 are spaced at predetermined gaps, and are extended in the same direction in parallel with each other. The gate trenches 106 penetrate the body region 105, so that deepest portions thereof reach the low-concentrated drain region 104. A gate electrode 108 made of polysilicon doped with highly-concentrated N type impurities is embedded in each gate trench 106 with a gate insulating film 107 between the gate electrode 108 and the epitaxial layer 103.

N+type source regions 109 are formed on the surface layer portion of the body region 105. Furthermore, P+type body contact regions 110 penetrate the source regions 109 in a layer thickness direction, and are formed at a gap from the gate trenches 106 at the surface layer portion of the body region 105.

An interlayer insulating film 111 is laminated on the epitaxial layer 103. Contact holes 112 are formed in the interlayer insulating film 111 at positions that face respective body contact regions 110 and parts of the source region 109 surrounding the same. A source wiring 113 is formed on the interlayer insulating film 111. Parts of the source wiring 113 enter the contact holes 112. As a result, a contact plug 114 is formed in the contact hole 112. The contact plug 114 is brought into contact (butting contact) with the source region 109 and with the body contact region 110 while stretching between the surface of the source region 109 and the surface of the body contact region 110.

A drain electrode 115 is formed on a back surface of the substrate 102.

The source wiring 113 is grounded, and the electric potential (gate voltage) of the gate electrode 108 is controlled while applying an appropriate amount of positive voltage to the drain electrode 115. Therefore, channels are formed near interfaces with the gate insulating films 107 in the body region 105, and electric current flow between the source regions 109 and the drain electrode 115.

In the trench-gate type VDMOSFET, the on-resistance can be further reduced by cell shrinkage in which the unit cell area is reduced.

However, with the progress of the cell shrinkage, the distance between the gate trench 106 and the body contact region 110 becomes smaller. Accordingly, the area of a portion facing the contact hole 112 in the source region 109 becomes small, and hence the contact area between the source region 109 and the contact plug 114 becomes small. As a result, the contact resistance between the source region 109 and the contact plug 114 is increased. The increase in the contact resistance is obstructive to a decrease in the on-resistance.

Additionally, with the progress of the cell shrinkage, the area of the body contact region 110 also becomes smaller. If the area of the body contact region 110 is small, a slight deviation of the formation position of the contact hole 112 from its normal position will disenable the contact hole 112 to face the body contact region 110, and hence there is a fear that the body contact region 110 and the contact plug 114 cannot be brought into contact with each other. Therefore, with the progress of the cell shrinkage, a permissible range with respect to a deviation of the formation position of the contact hole 112 becomes smaller, and hence the contact hole 112 is required to be formed with high accuracy.

In field-effect transistors other than the trench-gate type VDMOSFET without being limited to the trench-gate type VDMOSFET, the problem of the increase in the contact resistance (the problem of the decrease in the contact area) arises as a result of the cell shrinkage.

SUMMARY OF THE INVENTION

A first object of the present invention is to provide a semiconductor device capable of increasing the contact area between a source region and a contact plug.

A second object of the present invention is to provide a semiconductor device capable of preventing the contact area between a source region and a contact plug from being reduced by cell shrinkage and capable of reliably bringing the contact plug into butting contact with the source region and with a body contact region.

A semiconductor device according to one aspect of the present invention includes: a first conductive type semiconductor layer; a second conductive type source region formed in a surface layer portion of the semiconductor layer; a groove formed by digging in the source region from a surface thereof; an insulating film laminated on the semiconductor layer to cover a surface of the semiconductor layer; a contact hole penetrating through the insulating film in a layer thickness direction at least at a position facing the groove; a wiring formed on the insulating film; and a contact plug embedded in the contact hole so that a bottom portion thereof enters the groove to electrically connect the wiring and the source.

According to this structure, the second conductive type source region is formed in the surface layer portion of the first conductive type semiconductor layer. The groove is formed by digging in the source region from the surface thereof. The insulating film is laminated on the semiconductor layer. The surface of the semiconductor layer is covered with the insulating film. The contact hole penetrates through the insulating film in the layer thickness direction at least at a position facing the groove. The contact plug is buried in the contact hole.

The bottom portion of the contact plug enters the groove, and the contact plug contacts with the source region. In other words, the contact plug is in contact not only with the surface of the source region but also with the bottom face and the side face of the groove formed in the source region. Therefore, in comparison to a structure in which the contact plug contacts with only the surface of the source region, the contact area between the source region and the contact plug can be increased. As a result, the contact resistance between the source region and the contact plug can be reduced, and the on-resistance of the transistor including the source region can be reduced.

The semiconductor device may include a first conductive type body region formed in the semiconductor layer so as to be contiguous with the source region, a second conductive type drain region formed on a side opposite to the source region with respect to the body region so as to be contiguous with the body region, and a gate electrode penetrating through the body region and the source region in the layer thickness direction. Accordingly, the semiconductor device has a trench-gate type vertical transistor that is made up of the drain region, the gate electrode, and the source region.

In the trench-gate type vertical transistor, cell shrinkage makes it possible to reduce the on-resistance. Even if the area (i.e., area obtained by a planar view) of the surface of the source region is narrowed as a result of this cell shrinkage, a large contact area between the source region and the contact plug can be secured by allowing the contact plug to enter the groove formed in the source region. Therefore, the on-resistance of the vertical transistor can be effectively reduced.

The semiconductor device may further include a body contact region penetrating through the source region in the layer thickness direction and to be connected to the body region. In this case, the groove may be provided in the form of a plurality of grooves between the gate electrode and the body contact region.

The semiconductor device according to another aspect of the present invention includes: a semiconductor layer; a first conductive type body region formed in the semiconductor layer; a second conductive type source region formed in a surface layer portion of the semiconductor layer so as to be contiguous with the body region; a trench formed by digging in the semiconductor layer from a surface thereof to penetrate the source region in a layer thickness direction so that a deepest portion thereof is located nearer to a base layer portion of the semiconductor layer than a deepest part of the source region; a first conductive type body contact region formed in the semiconductor layer to be sandwiched between the body region and the deepest part of the trench; an insulating film laminated on the semiconductor layer to cover the surface of the semiconductor layer; a contact hole penetrating through the insulating film in the layer thickness direction at a position facing the trench so formed that a side face thereof is continuous with a side face of the trench; a wiring formed on the insulating film; and a contact plug formed so as to fill up the trench and the contact hole to be connected to the wiring.

According to this structure, the first conductive type body region is formed in the semiconductor layer. The second conductive type source region is formed in the surface layer portion of the semiconductor layer. The source region is contiguous to the body region. The trench is formed by digging in the semiconductor layer from the surface thereof. The trench penetrates through the source region in the layer thickness direction. The insulating film is laminated on the semiconductor layer, and the surface of the semiconductor layer is covered with the insulating film. The contact hole penetrates through the insulating film in the layer thickness direction at a position facing the trench. The side face of the contact hole is continuous with the side face of the trench.

The contact plug connected to the wiring is embedded in the trench and the contact hole. The trench and the contact hole are completely filled with this contact plug. Accordingly, the contact plug contacts with the source region on the side face of the trench. Therefore, the contact area between the source region and the contact plug is irrelevant to the area (i.e., area obtained by a planar view) of the surface of the source region. Therefore, the contact area between the source region and the contact plug can be prevented from being reduced by cell shrinkage.

Moreover, since the trench penetrates through the source region in the layer thickness direction, the contact plug can be reliably brought into contact with the source region even if the formation position of the trench is deviated.

The first conductive type body contact region is sandwiched between the body region and the deepest part of the trench. The body contact region can be formed, for example, by being doped with the first conductive type impurities from the inside of the trench to the neighborhood of the deepest portion of the trench. The contact of the contact plug with the body contact region can be reliably achieved by forming the body contact region and then burying the contact plug into the trench.

Therefore, the contact area between the source region and the contact plug can be prevented from being reduced by cell shrinkage, and the contact plug can be reliably brought into butting contact with the source region and the body contact region.

The deepest portion of the trench is located nearer to the base layer side of the semiconductor layer than the deepest portion of the source region. Therefore, the body contact region is formed near the drain region in a structure in which the body region is formed on the second conductive type drain region and the gate electrode penetrating through the body region and the source region in the layer thickness direction is provided. Therefore, for example, an avalanche current flows between the drain region and the body contact region, when a great counterelectromotive voltage is applied to the vertical transistor made up of the drain region, the gate electrode, and the source region by a flyback voltage generated at the turnoff in an inductive load. Consequently, a parasitic bipolar transistor made up of the drain region, the body region, and the source region can be prevented from being turned on, and a thermal breakdown (avalanche breakdown) can be prevented from being caused by the turn-on of the parasitic bipolar transistor. As a result, the avalanche resistance can be improved.

Preferably, the side face of the trench is inclined with respect to a direction perpendicular to the surface of the semiconductor layer in a structure (i.e., structure in which the semiconductor device includes a vertical transistor) in which the body region is formed on the second conductive type drain region and the gate electrode penetrating through the body region and the source region in the layer thickness direction is provided. Thus, the distance between the deepest portion of the trench and the gate electrode can be increased. As a result, the first conductive type impurities can be prevented from being diffused to a channel region (i.e., neighborhood of the gate electrode in the body region) when the body contact region is formed. Consequently, defects (e.g., a rise in threshold voltage of a vertical transistor) can be prevented from being caused by a rise in impurity concentration of the channel region.

The semiconductor device according to still another aspect of the present invention includes: a semiconductor layer; a first conductive type body region formed in the semiconductor layer; a second conductive type source region formed in a surface layer portion of the semiconductor layer so as to be contiguous with the body region; a second conductive type drain region that is formed on a side opposite to the source region with respect to the body region so as to be contiguous to the body region; a gate electrode penetrating through the body region and penetrating the source region in a layer thickness direction; a trench formed by digging in the semiconductor layer from a surface penetrate the source region in the layer thickness direction so that a deepest portion thereof is located nearer to a base layer side of the semiconductor layer than a deepest portion of the source region; a first conductive type body contact region formed in the semiconductor layer to be sandwiched between the body region and the deepest part of the trench; and a contact plug embedded in the trench. A side face of the trench is inclined with respect to a direction perpendicular to the surface of the semiconductor layer.

According to this structure, the first conductive type body region is formed in the semiconductor layer. The second conductive type source region is formed in the surface layer portion of the semiconductor layer. The source region is contiguous to the body region. The drain region is formed on a side opposite to the source region with respect to the body region. The drain region is contiguous to the body region. The gate electrode penetrates through the body region and the source region in the layer thickness direction.

The trench is formed by digging in the semiconductor layer from the surface thereof. The trench penetrates through the source region in the layer thickness direction. The contact plug is embedded in the trench. Accordingly, the contact plug contacts with the source region at least in the side face of the trench. Therefore, the contact area between the source region and the contact plug in the side face of the trench is irrelevant to the area (i.e., area obtained by a planar view) of the surface of the source region. Therefore, the contact area between the source region and the contact plug can be prevented from being reduced by cell shrinkage.

Moreover, since the trench penetrates through the source region in the layer thickness direction, the contact plug can be reliably brought into contact with the source region even if the formation position of the trench is deviated.

The first conductive type body contact region is sandwiched between the body region and the deepest portion of the trench. The body contact region can be formed, for example, by being doped with the first conductive type impurities from the inside of the trench to the neighborhood of the deepest portion of the trench. The contact of the contact plug with the body contact region can be reliably achieved by forming the body contact region and then burying the contact plug into the trench.

Therefore, the contact area between the source region and the contact plug can be prevented from being reduced by cell shrinkage, and the contact plug can be reliably brought into butting contact with the source region and the body contact region.

The deepest portion of the trench is located nearer to the base layer side of the semiconductor layer than the deepest portion of the source region. Therefore, the body contact region is formed near the drain region. Therefore, for example, an avalanche current flows between the drain region and the body contact region, when a great counterelectromotive voltage is applied to the vertical transistor made up of the drain region, the gate electrode, and the source region by a flyback voltage generated at the turnoff in an inductive load. As a result, a parasitic bipolar transistor made up of the drain region, the body region, and the source region can be prevented from being turned on, and a thermal breakdown (avalanche breakdown) can be prevented from being caused by the turn-on of the parasitic bipolar transistor. Therefore, the avalanche resistance can be improved.

Additionally, the side face of the trench is inclined with respect to a direction perpendicular to the surface of the semiconductor layer. Thus, the distance between the deepest portion of the trench and the gate electrode can be increased.

As a result, the first conductive type impurities can be prevented from being diffused to a channel region (i.e., neighborhood of the gate electrode in the body region) when the body contact region is formed. Consequently, defects (e.g., a rise in threshold voltage of a vertical transistor) can be prevented from being caused by a rise in impurity concentration of the channel region.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
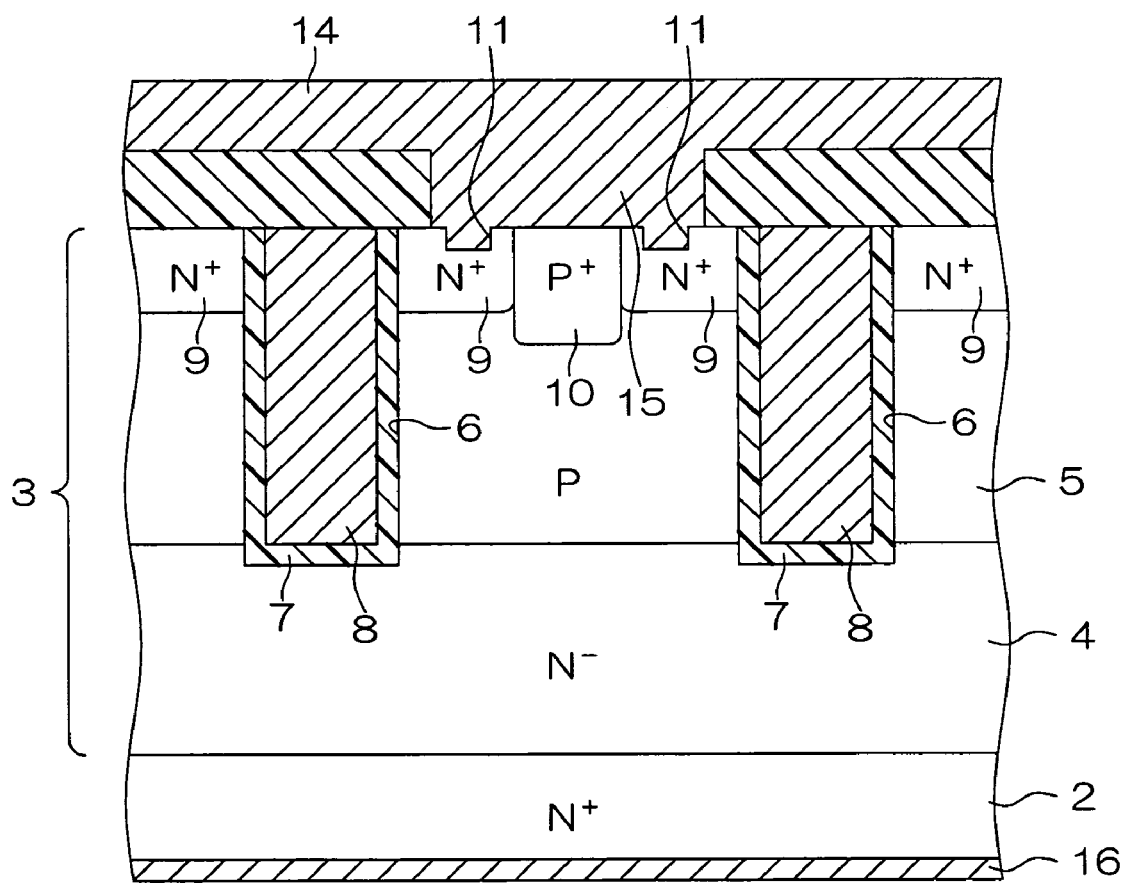
FIG. 1 is a schematic sectional view of a semiconductor device according to a first embodiment of the present invention.
Figure 2:
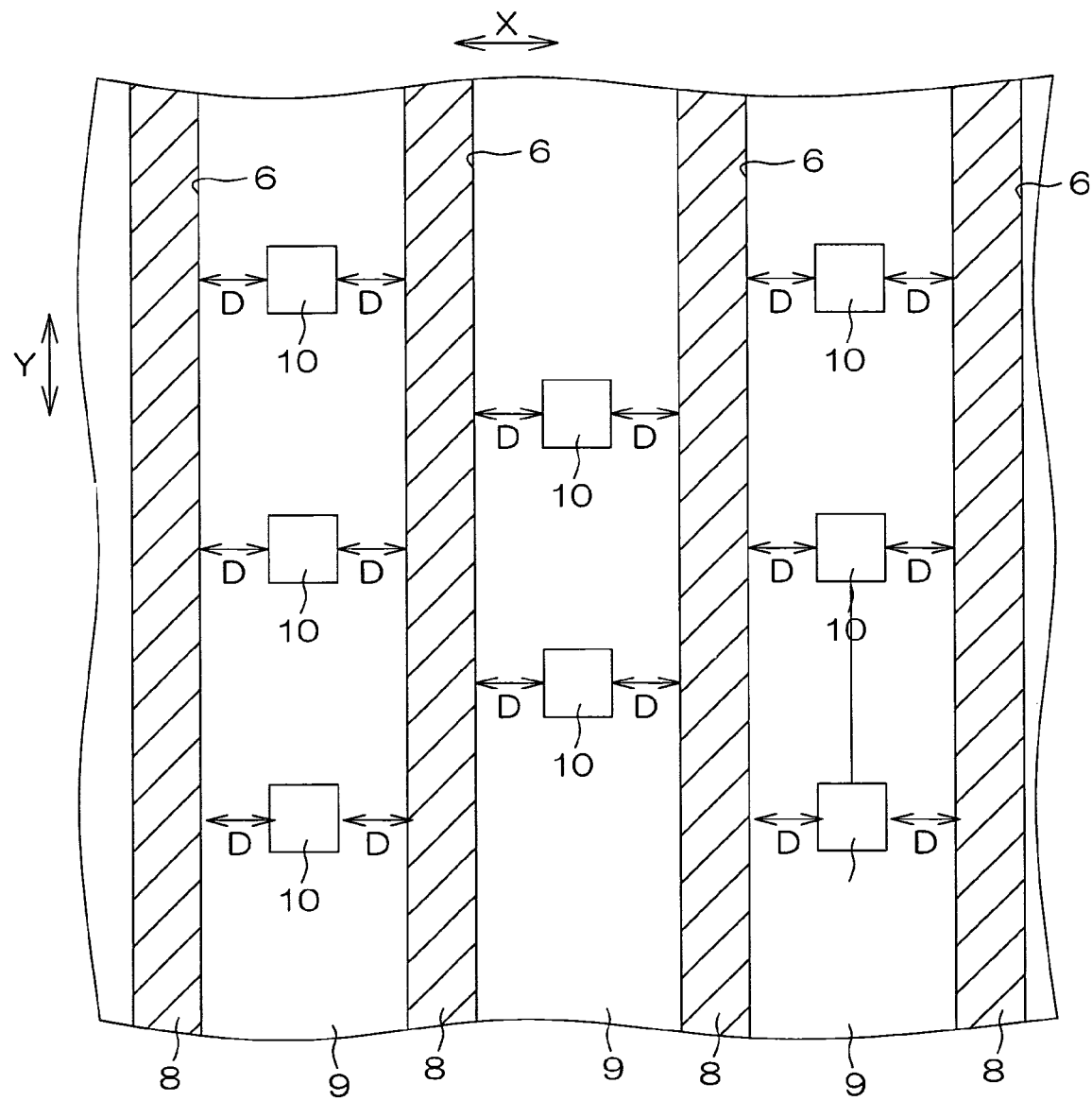
FIG. 2 is a schematic plan view of a first layout of gate electrodes and body contact regions in a semiconductor device shown in FIG. 1.

FIG. 1 is a schematic sectional view of a semiconductor device according to a first embodiment of the present invention. FIG. 2 is a schematic plan view of a layout of gate electrodes and body contact regions in a semiconductor device shown in FIG. 1.

The semiconductor device 1 has a structure in which unit cells of trench-gate type VDMOSFETs are arranged in a matrix manner.

An N$^-$type epitaxial layer 3 is laminated on an N$^+$type silicon substrate 2 that serves as a base of the semiconductor device 1. The epitaxial layer 3 is made of silicon doped with a lower concentration of N type impurities than the silicon substrate 2. A base layer portion of the epitaxial layer 3 maintains an unchanged state after its epitaxial growth, and serves as an N$^-$type low-concentrated drain region 4. Furthermore, in the epitaxial layer 3, a P type body region 5 is formed on the low-concentrated drain region 4 to be bounded on the same.

A plurality of gate trenches 6 are formed by digging in the epitaxial layer 3 from the surface thereof. As shown in FIG. 2, the gate trenches 6 are spaced at regular gaps in a direction X and extended in the same direction Y (i.e., in a direction perpendicular to the sheet of FIG. 1) in parallel with each other. Each gate trench 6 penetrates through the body region 5 in the layer thickness direction, so that a deepest portion thereof reaches the low-concentrated drain region 4. A gate insulating film 7 made of an oxide silicon is formed in each gate trench 6 so as to cover the entire inner surface thereof. Furthermore, the inside of each gate insulating film 7 is completely filled with polysilicon doped with highly-concentrated N type impurities, hence a gate electrode 8 is embedded in each gate trench 6.

$N^+$ type source regions 9 are formed in the surface layer portion of the epitaxial layer 3 in the whole area between the gate trenches 6. That is, the gate trenches 6 and the source regions 9 are alternately disposed in the direction X orthogonal to a gate width (which is the direction perpendicular to the sheet of FIG. 1), and extended in the direction X along the gate width. The source regions 9 are contiguous to the body region 5.

Furthermore, a plurality of $P^+$ type body contact regions 10 are formed between the gate trenches 6 in the epitaxial layer 3. As shown in FIG. 2, the body contact regions 10 have square shapes and are disposed in a zigzag alignment in a plan view. More specifically, the body contact regions 10, each of which is formed at a fixed gap D from the gate trench 6 between the gate trenches 6, are equally spaced out in the direction Y along the gate width. In two columns that are mutually adjacent in the direction X, the body contact regions 9 forming one column and the body contact regions 9 forming the other column are in a positional relationship of being shifted by a half pitch (half of the pitch at which the body contact regions 9 are positioned in the direction Y). Each body contact region 10 penetrates through the source region 9 in the layer thickness direction.

Concave grooves 11 are formed by digging in from the surface of the source region 9. Each groove 11 is extended in the direction along the gate width between the gate trench 6 and the body contact region 10. The grooves 11 are formed, for example, by forming the source region 9 in the surface layer portion of the epitaxial layer 3 and then partially removing the source region 9. Photolithography and etching make it possible to partially remove the source region 9.

An insulating film 12 made of an insulating material (e.g., silicon oxide or silicon nitride) is laminated on the epitaxial layer 3. Contact holes 13 penetrate through the insulating film 12 in the layer thickness direction at respective positions facing the body contact regions 10 and the grooves 11.

A source wiring 14 made of a conductive material (e.g., aluminum) is formed on the insulating film 12. The conductive material of the source wiring 14 enters each contact hole 13, so that each contact hole 13 is completely filled with this conductive material, hence contact plugs 15 are embedded in the contact holes 13. A bottom portion of each contact plug 15 enters the groove 11, hence each contact plug 15 contact with the source region 9 and the body contact region 10. Therefore, the source regions 9, the body contact regions 10, and the source wiring 14 are electrically connected together via the contact plugs 15.

A drain electrode 16 is formed on the back surface of the silicon substrate 2.

The source wiring 14 is grounded, and the electric potential (gate voltage) of the gate electrodes 8 are controlled while applying an appropriate amount of positive voltage to the drain electrode 16. Therefore, channels are formed near interfaces with the gate insulating films 7 in the body region 5, and electric current flow between the source regions 9 and the drain electrode 16.

As mentioned above, the contact plugs 15 are in contact with not only the surfaces of the source regions 9 but also the bottom faces and the side faces of the grooves 11 formed in the source regions 9. Therefore, in comparison to a structure in which the contact plugs 15 contact with only the surface of the source regions 9. The contact area between the source regions 9 and the contact plugs 15 can be increased. As a result, the contact resistance between the source regions 9 and the contact plugs 15 can be reduced, and the on-resistance of the trench-gate type VDMOSFETs made up of the low-concentrated drain region 4, the gate electrodes 8, and the source regions 9 can be reduced.

Additionally, in the trench-gate type VDMOSFETs, the on-resistance can be reduced by cell shrinkage. Even if the area (i.e., area obtained by a planar view) of the surface of the source regions 9 become small as a result of the cell shrinkage, the entrance of the contact plug 15 into the groove 11 formed in each source region 9 makes it possible to secure a large contact area between the source region 9 and the contact plug 15. Therefore, the on-resistance of the trench-gate type VDMOSFETs can be effectively reduced.

Figure 3:
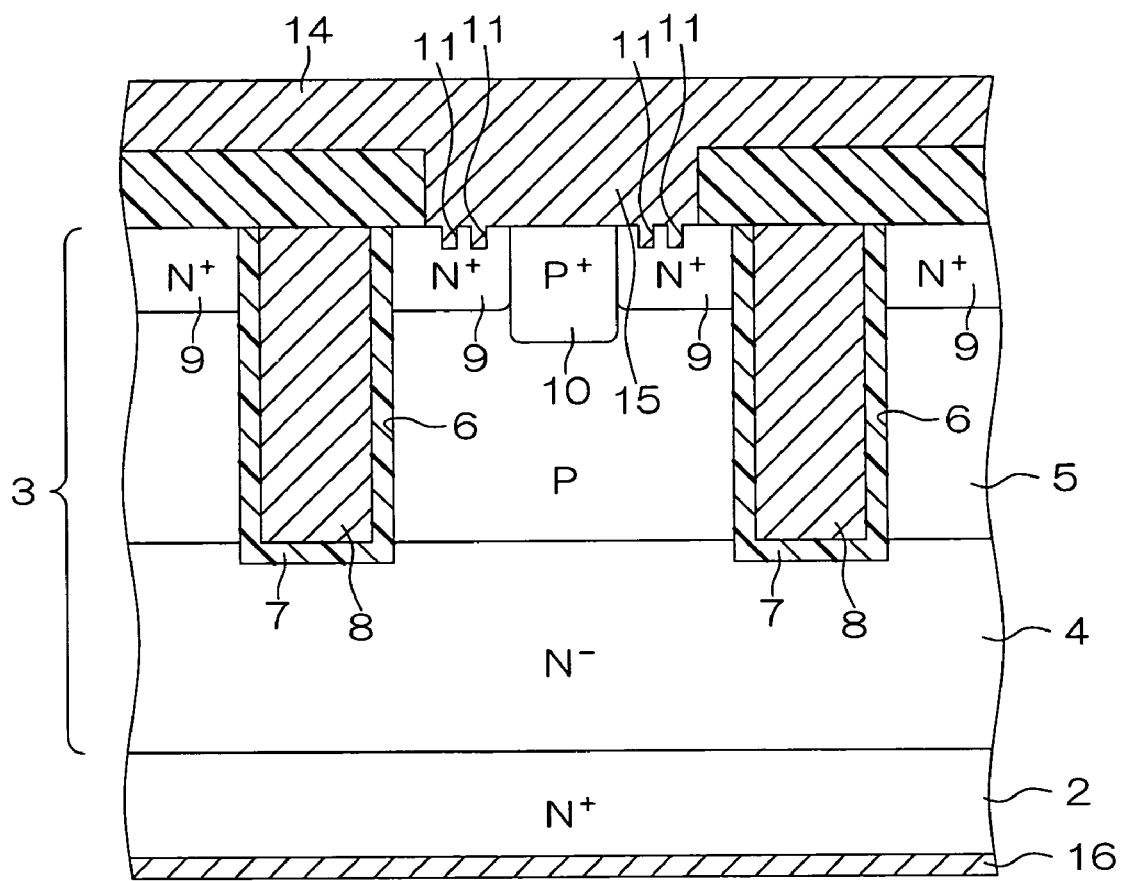
FIG. 3 is a schematic sectional view for explaining a modification of the structure of the semiconductor device shown in FIG. 1.

For example, as shown in FIG. 3, a plurality of grooves 11 may be formed between the gate trench 6 and the body contact region 10.

Additionally, in the semiconductor device 1 shown in FIGS. 1 and 3, the conductive types in the semiconductor regions may be reversed. In other words, in the semiconductor device 1, the N type region may be changed into the P type region, whereas the P type region may be changed into the N type region.

Still additionally, without being limited to a structure including trench-gate type VDMOSFETs, the invention according to the embodiment shown in FIGS. 1 and 3 may be applied to a structure including planer-gate type VDMOSFETs or to a structure including LDMOSFETs (Lateral Double diffused Metal Oxide Semiconductor Field Effect Transistor). Still additionally, the invention can be applied to a structure including other kinds of field-effect transistors excluding the DMOSFET.

Figure 4:
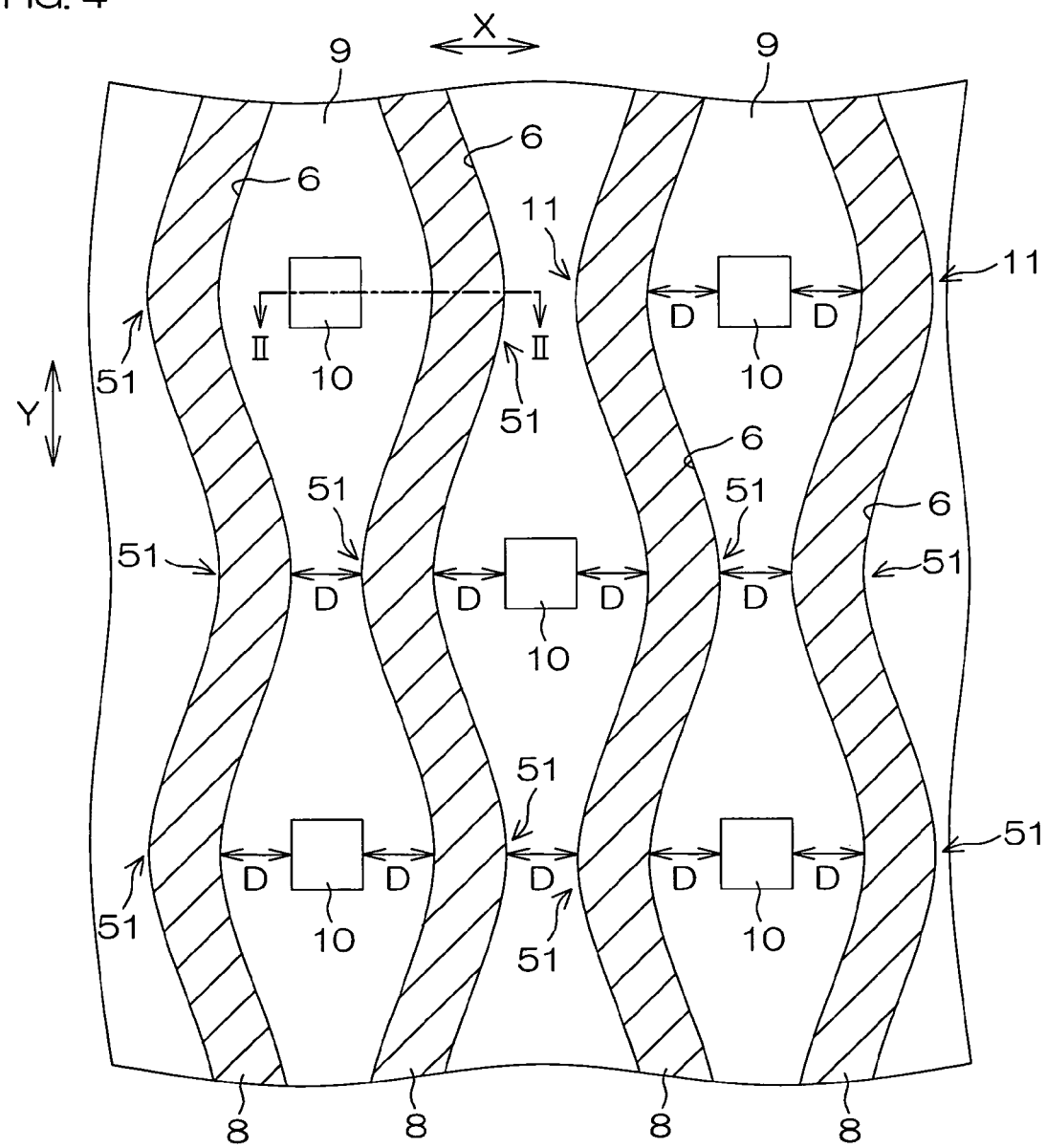
FIG. 4 is a schematic plan view of a second layout of gate electrodes and body contact regions in the semiconductor device shown in FIG. 1.

FIG. 4 is a schematic plan view of another layout of gate electrodes and body contact regions in the semiconductor device shown in FIG. 1. In FIG. 4, portions equivalent to respective portions shown in FIG. 2 are provided with the same reference symbols as these portions.

In a structure shown in FIG. 4, each trench 5 extends in the direction Y and forms a meandering line connecting a plurality of curved portions 51 so that the fixed gap D in the row direction X is formed respectively between adjacent trenches 6 and between the trenches 6 and the body contact regions 10.

Thus, in comparison to the structure shown in FIG. 2, that is, the structure where body contact regions 10 are formed in an array in a plan view and rectilinearly extending gate electrodes 8 are formed between respective columns formed by the body contact regions 10 that are aligned in the column direction, a gate width (total length of a gate in a plan view) in a single unit cell can be increased in correspondence to the meandering of the gate electrodes 8 and a channel area per unit cell area can thus be increased. Consequently, an ON resistance can be reduced. Further, because the trenches 6 do not have corner portions, when a stress is applied to the semiconductor device 1, localized concentration of stress on the gate electrodes 8 embedded in the trenches 6 can be prevented.

Figure 5:
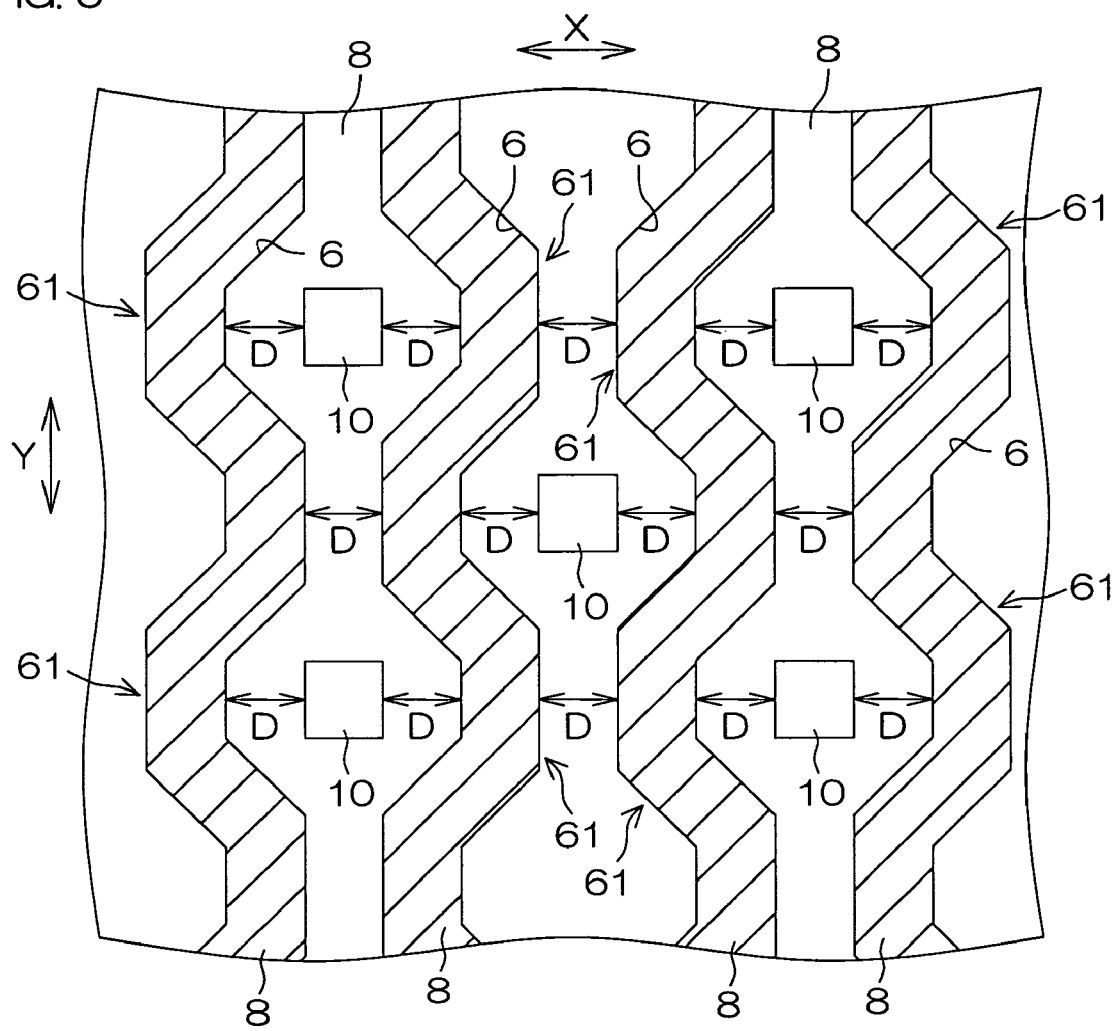
FIG. 5 is a schematic plan view of a third layout of gate electrodes and body contact regions in the semiconductor device shown in FIG. 1.

FIG. 5 is a schematic plan view of a third layout of gate electrodes and body contact regions in the semiconductor device shown in FIG. 1. In FIG. 5, portions equivalent to respective portions shown in FIG. 2 are provided with the same reference symbols as these portions.

In a structure shown in FIG. 5, trenches 6 extend in the direction Y and form meandering lines connecting a plurality of bent portions 61 so that the fixed gap D in the row direction X is formed respectively between adjacent trenches 6 and between the trenches 6 and the body contact regions 10. Each bent portion 61 has a shape that bends to one side in the row direction X at an inner angle of 120 degrees with respect to a portion extending in the direction Y of the trench 6, then extends in the direction Y, and then bends to the other side in the direction X at an inner angle of 120 degrees with respect to the portion extending in the direction Y.

Thus, in comparison to a structure shown in FIG. 2, the gate width (total length of the gate in a plan view) in the single unit cell can be increased in correspondence to the meandering of the gate electrodes 8 and the channel area per unit cell area can thus be increased. Consequently, the ON resistance can be reduced as with the configuration shown in FIG. 4. Further, because the bent portions 61 of the trenches 6 are bent at the inner angle greater than 90 degrees, when a stress is applied to the semiconductor device 1, localized concentration of stress on the gate electrodes 8 embedded in the trenches 6 can be prevented.

Figure 6:
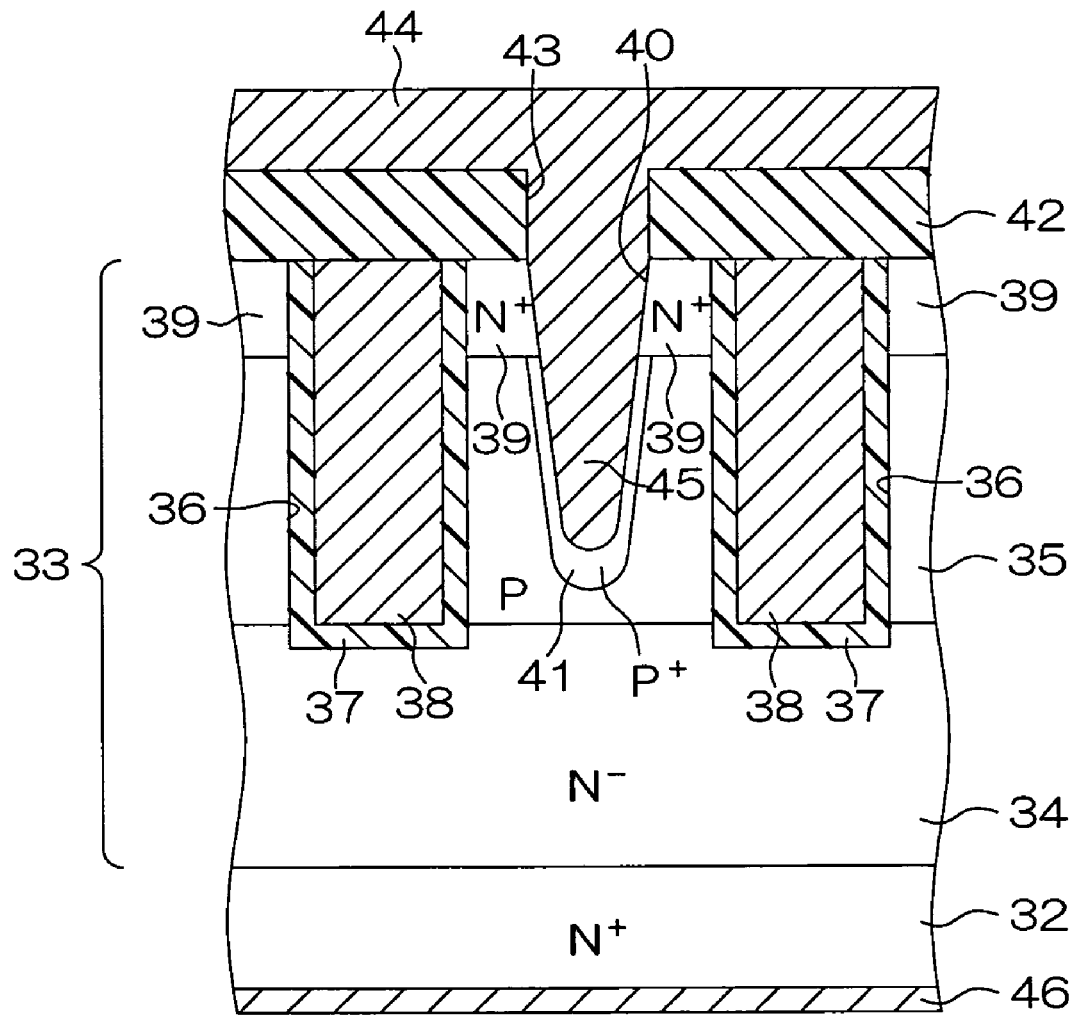
FIG. 6 is a schematic sectional view of a semiconductor device according to a second embodiment of the present invention.

FIG. 6 is a schematic sectional view of a semiconductor device according to a second embodiment of the present invention.

The semiconductor device 31 has a structure in which unit cells of trench-gate type VDMOSFETs are arranged in a matrix manner.

An N⁻type epitaxial layer 33 is laminated on an N⁺type silicon substrate 32 that serves as a base of the semiconductor device 31. The epitaxial layer 33 is made of silicon doped with a lower concentration of N type impurities than the silicon substrate 32. A base layer portion of the epitaxial layer 33 maintains an unchanged state after its epitaxial growth, and serves as an N-type low-concentrated drain region 34. Furthermore, in the epitaxial layer 33, a P type body region 35 is formed on the low-concentrated drain region 34 to be bounded on the same.

A plurality of gate trenches 36 are formed by digging in the epitaxial layer 33 from the surface thereof. The gate trenches 36 are spaced at regular gaps and are extended in the same direction (i.e., in a direction perpendicular to the sheet of FIG. 6) in parallel with each other. Each gate trench 36 penetrates through the body region 35 in the layer thickness direction, so that a deepest portion thereof reaches the low-concentrated drain region 34. A gate insulating film 37 made of an oxide silicon is formed in each gate trench 36 so as to cover the entire inner surface thereof. Furthermore, the inside of the gate insulating film 37 is completely filled with polysilicon doped with highly-concentrated N type impurities, hence a gate electrode 38 is embedded in each gate trench 36.

N⁺type source regions 39 are formed in the surface layer portion of the epitaxial layer 33 in the whole area between the gate trenches 36. That is, the gate trenches 36 and the source regions 39 are alternately disposed in a direction orthogonal to a gate width (which is the direction perpendicular to the sheet of FIG. 6), and extended in a direction along the gate width. The source regions 39 are contiguous to the body region 35.

Furthermore, a plurality of plug-burying trenches 40 are formed between the gate trenches 36 by digging in the epitaxial layer 33 from the surface thereof. More specifically, the plug-burying trenches 40, each of which is formed at a gap from the gate trench 36 between the gate trenches 36, are equally spaced out in the direction along the gate width. Each plug-burying trench 40 has a substantially conical shape tapered toward the bottom, and a side face thereof is inclined at a predetermined angle (e.g., 5 to 45 degrees) with respect to a direction perpendicular to the surface of the epitaxial layer 33. The deepest portion of each plug-burying trench 40 is nearer to the base layer side of the epitaxial layer 33 than the deepest portion of the source regions 39.

A P⁺type body contact region 41, which is higher in the concentration of P type impurities than the body region 35, is formed in the body region 35 around a portion (i.e., a part including the deepest portion; hereinafter, referred to simply as "deepest portion") of each plug-burying trench 40 nearer to the base layer side of the epitaxial layer 33 than the deepest portion of the source regions 39.

An insulating film 42 made of an insulating material (e.g., silicon oxide or silicon nitride) having an etching selection ratio with respect to the epitaxial layer 33 is laminated on the epitaxial layer 33. A substantially cylindrical contact hole 43 penetrates through the insulating film 42 in the layer thickness direction at a position facing each plug-burying trench 40. The side face of each contact hole 43 is continuous with the side face of the plug-burying trench 40.

A source wiring 44 made of a conductive material (e.g., aluminum) is formed on the insulating film 42. The conductive material of the source wiring 44 enters each plug-burying trench 40 and each contact hole 43, so that each plug-burying trench 40 and each contact hole 43 are completely filled with this conductive material, and, hence the contact plugs 45 are embedded in the plug-burying trenches 40 and the contact holes 43. Therefore, each contact plug 45 comes into contact (butting contact) with the source region 39 and with the body contact region 41 at the side face of the plug-burying trench 40.

A drain electrode 46 is formed on the back surface of the silicon substrate 32.

The source wiring 44 is grounded, and the electric potential (gate voltage) of the gate electrodes 38 are controlled while applying an appropriate amount of positive voltage to the drain electrode 46. Therefore, channels are formed near interfaces with the gate insulating films 37 in the body region 35, and electric current flow between the source regions 39 and the drain electrode 46.

FIGS. 7A to 7F are schematic sectional views showing a method of manufacturing a semiconductor device step by step.

Figure 7A:
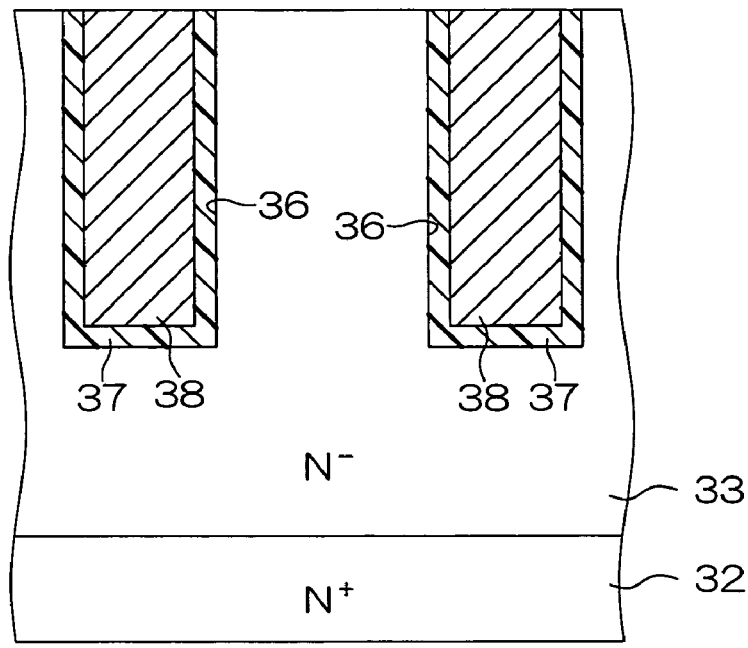
FIG. 7A is a schematic sectional view for explaining a method of manufacturing the semiconductor device shown in FIG. 6.

First, as shown in FIG. 7A, the epitaxial layer 33 is formed on the silicon substrate 32 by an epitaxial growth method. Then, the gate trenches 36 are formed in the epitaxial layer 33 by photolithography and etching. Thereafter, the gate insulating film 37 is formed on the inner surface of each gate trench 36 by thermal oxidation treatment. Thereafter, a deposition layer of polysilicon doped with highly-concentrated N type impurities is formed on the epitaxial layer 33 and on the gate insulating film 37 by a CVD (Chemical Vapor Deposition) method. The inside of each gate trench 36 is completely filled with the polysilicon deposition layer. Thereafter, a portion of the polysilicon deposition layer outside the gate trench 36 is removed by etchback. As a result, the gate electrodes 38 embedded in the gate trenches 36 are obtained.

Figure 7B:
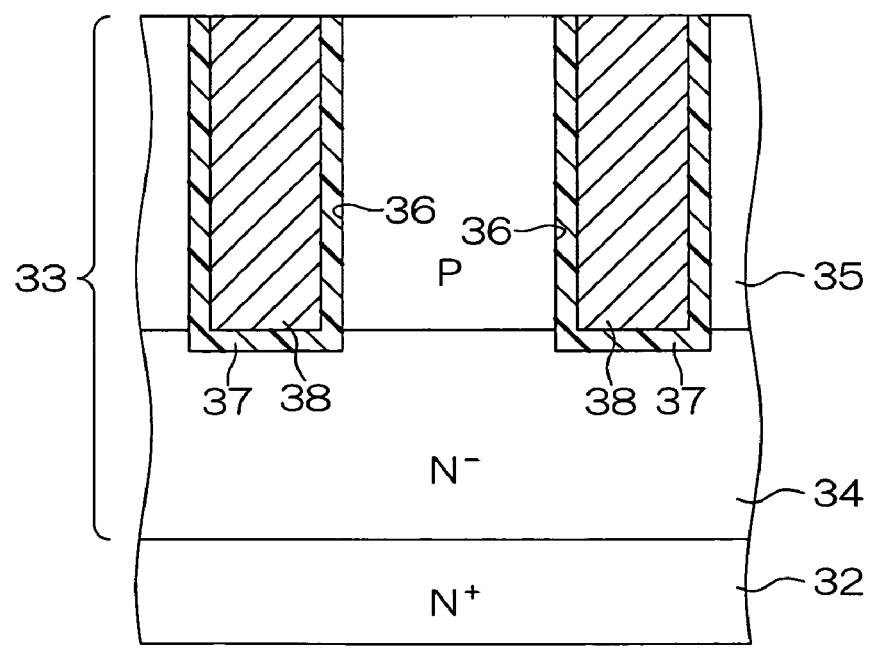
FIG. 7B is a schematic sectional view showing a step following the step of FIG. 7A.

Thereafter, P type impurities (e.g., boron ions) are implanted into the epitaxial layer 33 from the surface thereof by an ion-implantation method. Heat treatment is then performed to diffuse the P type impurities, hence the body region 35 is formed in the surface layer portion of the epitaxial layer 33 as shown in FIG. 7B.

Figure 7C:
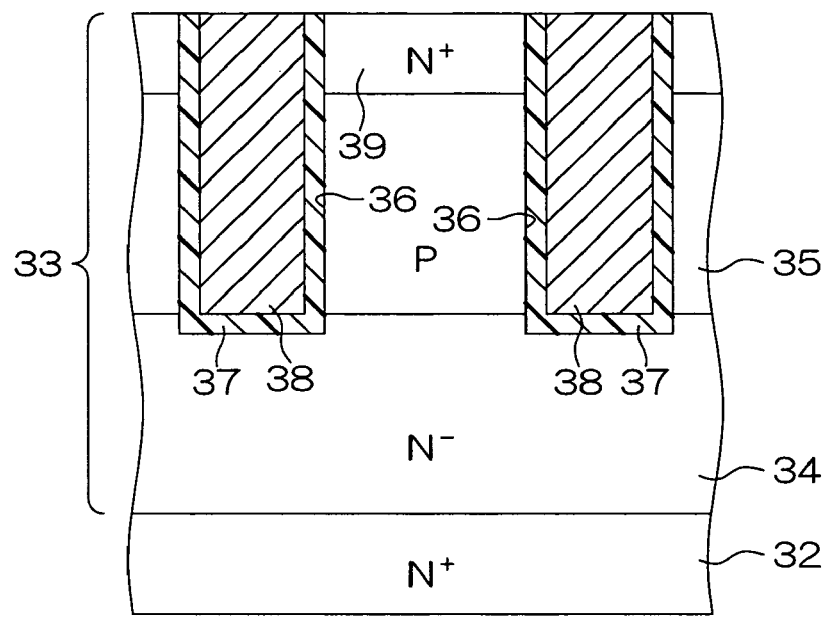
FIG. 7C is a schematic sectional view showing a step following the step of FIG. 7B.

Thereafter, N type impurities (e.g., arsenic ions) are implanted into the epitaxial layer 33 from the surface thereof by the ion-implantation method. Heat treatment is then performed to diffuse the N type impurities, hence the source regions 39 are formed in the surface layer portion of the epitaxial layer 33 as shown in FIG. 7C.

Figure 7D:
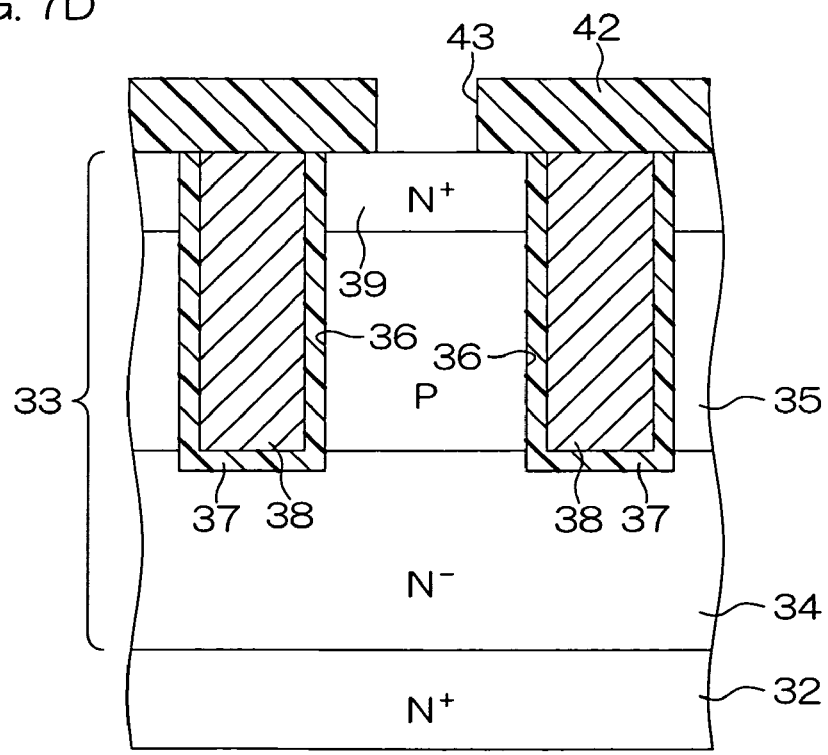
FIG. 7D is a schematic sectional view showing a step following the step of FIG. 7C.

Thereafter, as shown in FIG. 7D, the insulating film 42 is formed on the epitaxial layer 33 by the CVD method. Furthermore, a mask (not shown) having openings that face a portion where the contact holes 43 are to be bored is formed on the insulating film 42 by photolithography. The contact hole 43 is formed in the insulating film 42 by etching with the mask. After forming the contact hole 43, the mask on the insulating film 42 is removed.

Figure 7E:
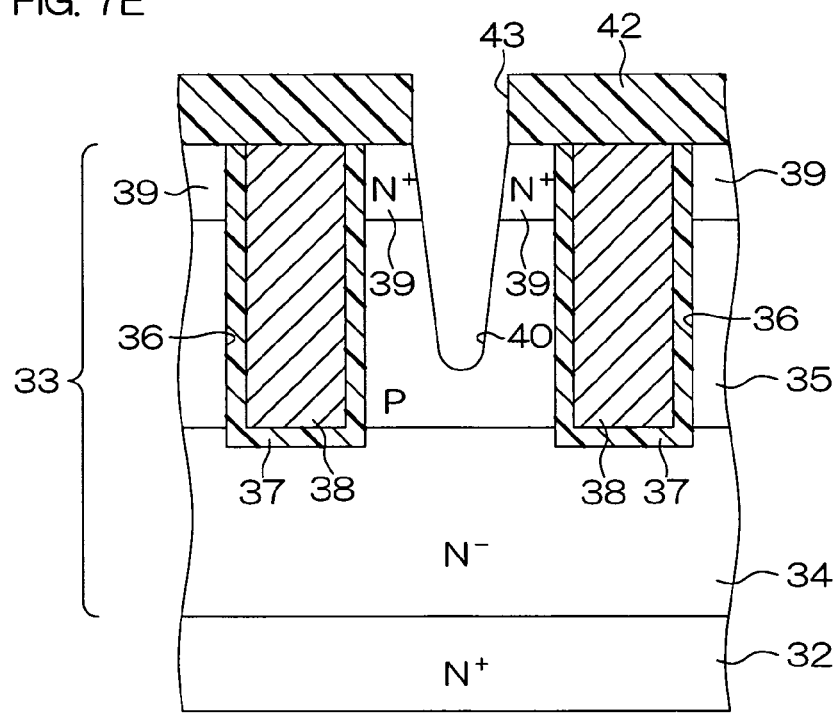
FIG. 7E is a schematic sectional view showing a step following the step of FIG. 7D.

Thereafter, as shown in FIG. 7E, the plug-burying trenches 40 are formed in the epitaxial layer 33 by etching in which the insulating film 42 is used as a mask. At this time, etching conditions are appropriately adjusted, therefore the plug-burying trenches 40 are formed into a substantially conical shape so that the side face of each plug-burying trench 40 is inclined at a predetermined angle with respect to a direction perpendicular to the surface of the epitaxial layer 33.

Figure 7F:
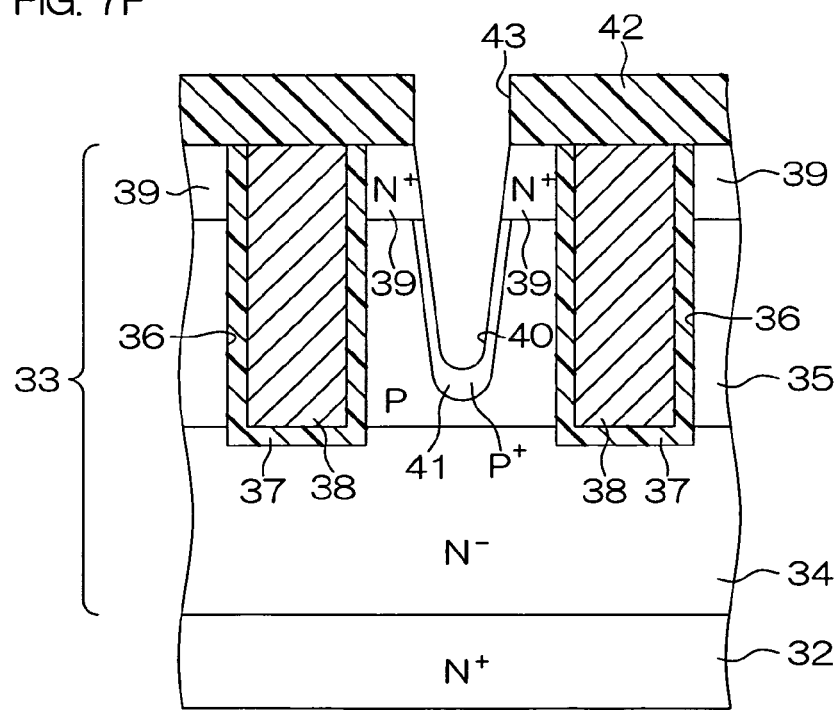
FIG. 7F is a schematic sectional view showing a step following the step of FIG. 7E.
Figure 8:
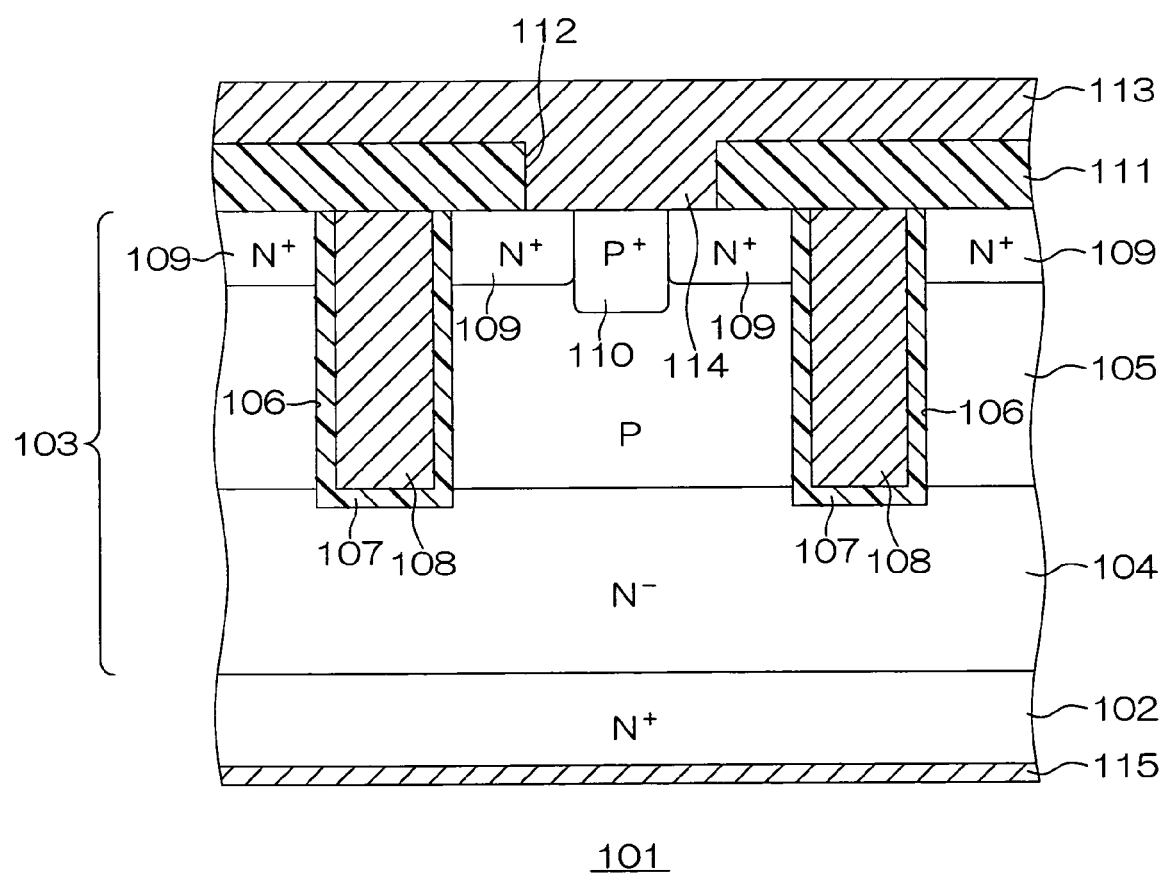
FIG. 8 is a schematic sectional view of a semiconductor device that includes conventional trench-gate type VDMOSFETs.

Thereafter, by the ion-implantation method, P type impurities are implanted from the side face of each plug-burying trench 40 into the epitaxial layer 33 via the contact hole 43 while using the insulating film 42 as a mask. By a heat treatment to diffuse the P type impurities, the body contact region 41 is formed around the deepest portion of each plug-burying trench 40 as shown in FIG. 7F.

It is permissible to perform etching to form the plug-burying trenches 40 and the implantation of the P type impurities to form the body contact region 41 via the mask used to form the contact hole 43 without removing the mask. When these are performed, the mask on the insulating film 42 is removed after the implantation of the P type impurities.

Thereafter, a conductive material is allowed to adhere onto the insulating film 42 by a plating method. The plug-burying trenches 40 and the contact holes 43 are completely filled with the conductive material, the conductive material adheres (deposits) onto the insulating film 42 so as to form a thin film thereon. Thereafter, the thin film made of the conductive material on the insulating film 42 is patterned by photolithography and etching. As a result, the source wiring 44 and the contact plugs 45 are formed. Furthermore, the plating method, the drain electrode 46 is formed on the back surface of the silicon substrate 32. As a result, the semiconductor device 31 shown in FIG. 6 is obtained.

As described above, the P type body region 35 is formed in the epitaxial layer 33. The N type source regions 39 are formed in the surface layer part of the epitaxial layer 33. The source regions 39 are contiguous to the body region 35. The plug-burying trenches 40 are formed by digging in the epitaxial layer 33 from the surface thereof. The plug-burying trenches 40 penetrate through the source region 39 in the layer thickness direction. The insulating film 42 is laminated on the epitaxial layer 33, and the surface of the epitaxial layer 33 is covered with the insulating film 42. The contact hole 43 penetrates through the insulating film 42 in the layer thickness direction at a position facing each plug-burying trench 40. The side face of each contact hole 43 is continuous with the side face of the plug-burying trench 40.

The contact plugs 45 connected to the source wiring 44 are embedded in the plug-burying trenches 40 and in the contact holes 43. The plug-burying trenches 40 and the contact holes 43 are completely filled with this contact plugs 45. Hence, each contact plug 45 contacts with the source region 39 in the side face of the plug-burying trench 40. Therefore, the contact area between the source regions 39 and the contact plugs 45 is irrelevant to the area (i.e., area obtained by a planar view) of the surface of the source regions 39. Therefore, the contact area between the source regions 39 and the contact plugs 45 can be prevented from being reduced by cell shrinkage.

Additionally, since the plug-burying trenches 40 penetrate through the source regions 39 in the layer thickness direction, the contact of each contact plug 45 with the source region 39 is reliably achieved even if the formation position of the plug-burying trenches 40 are deviated.

Additionally, the P type body contact region 41 is sandwiched between the body region 35 and the deepest portion of each plug-burying trench 40. As mentioned above, the body contact regions 41 are formed by being doped with the P type impurities from the inside of the plug-burying trenches 40 to the neighborhood of the deepest portion of the plug-burying trenches 40. Thereafter, the body contact region 41 is formed, and then the contact plug 45 is buried into each plug-burying trench 40. As a result, the contact of each contact plug 45 with the body contact region 41 can be reliably achieved.

Therefore, in the semiconductor device 31, the contact area between the source regions 39 and the contact plug 45 can be prevented from being reduced by cell shrinkage, and the butting contact of each contact plug 45 with the source region 39 and with the body contact region 41 can be reliably achieved.

Additionally, the body region 35 is formed on the N⁻type low-concentrated drain region 34, and the gate electrodes 38 penetrating through the body region 35 and the source regions 39 in the layer thickness direction are provided. The deepest portion of each plug-burying trench 40 is nearer to the base layer side of the epitaxial layer 33 than the deepest portions of the source regions 39. Therefore, the body contact regions 41 are formed to be near to the low-concentrated drain region 34. Therefore, for example, avalanche current flow between the low-concentrated drain region 34 and the body contact regions 41 when a great counterelectromotive voltage is applied to the trench-gate type VDMOSFETs made up of the low-concentrated drain region 34, the gate electrodes 38, and the source regions 39 by a flyback voltage generated at the turnoff in an inductive load. As a result, a parasitic bipolar transistors made up of the low-concentrated drain region 34, the body region 35, and the source regions 39 can be prevented from being turned on, and a thermal breakdown (avalanche breakdown) can be prevented from being caused by the turn-on of the parasitic bipolar transistor. Therefore, the avalanche resistance can be improved.

Still additionally, since the side face of each plug-burying trench 40 is inclined with respect to the direction perpendicular to the surface of the epitaxial layer 33, the distance between the deepest portions of the plug-burying trenches 40 and the gate electrodes 38 can be increased. As a result, the P type impurities can be prevented from being diffused to channel regions (i.e., neighborhood of the gate electrodes 38 in the body region 35) when the body contact regions 41 are formed. Consequently, defects (e.g., arise in threshold voltage of the trench-gate type VDMOSFET) can be prevented from being caused by a rise in impurity concentration of the channel regions.

In the semiconductor device 31 shown in FIG. 6, the conductive types of the semiconductor regions may be reversed. For example, in the semiconductor device 31, a region having an N type may be changed to have a P type, whereas a region having a P type may be changed to have an N type.

The present invention according to the embodiment shown in FIG. 6 is not limited to a structure including trench-gate type VDMOSFETs, and may be applied to a structure including planer-gate type VDMOSFETs, or may be applied to a structure including LDMOSFETs (Lateral Double diffused Metal Oxide Semiconductor Field Effect Transistor).

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-92676 filed with the Japan Patent Office on Mar. 31, 2008, and Japanese Patent Application No. 2008-92677 filed therewith on Mar. 31, 2008, the disclosure of these applications are incorporated herein by reference.

What is claimed is:

1. A semiconductor device comprising:
a semiconductor layer;
a first conductive type body region disposed in the semiconductor layer;
a second conductive type source region disposed in a surface layer portion of the semiconductor layer so as to be contiguous with the body region;
a groove extending into the source region from a surface thereof such that the groove does not penetrate entirely through the source region;
an insulating film that is laminated on the semiconductor layer to cover a surface of the semiconductor layer;
a contact hole penetrating through the insulating film in a layer thickness direction at least at a position facing the groove;
a wiring disposed on the insulating film; and
a contact embedded in the contact hole so that a bottom portion thereof enters the groove to electrically connect the wiring and the source.

2. The semiconductor device according to claim 1, further comprising:
a second conductive type drain region that is disposed on a side opposite to the source region with respect to the body region so as to be contiguous with the body region; and
a gate electrode penetrating through the body region and the source region in the layer thickness direction.

3. The semiconductor device according to claim 2, further comprising a body contact region penetrating through the source region in the layer thickness direction to be connected to the body region.

4. The semiconductor device according to claim 3, wherein a plurality of the grooves are disposed between the gate electrode and the body contact region.

5. A semiconductor device comprising:
a semiconductor layer;
a first conductive type body region disposed in the semiconductor layer;
a second conductive type source region disposed in a surface layer portion of the semiconductor layer so as to be contiguous with the body region;
a groove extending into the source region from a surface thereof;
an insulating film that is laminated on the semiconductor layer to cover a surface of the semiconductor layer;
a contact hole penetrating through the insulating film in a layer thickness direction at least at a position facing the groove;
a wiring disposed on the insulating film;
a contact embedded in the contact hole so that a bottom portion thereof enters the groove to electrically connect the wiring and the source;
a second conductive type drain region that is disposed on a side opposite to the source region with respect to the body region so as to be contiguous with the body region;
a gate electrode penetrating through the body region and the source region in the layer thickness direction; and
a body contact region penetrating through the source region in the layer thickness direction to be connected to the body region.

6. The semiconductor device according to claim 5, wherein a plurality of the grooves are disposed between the gate electrode and the body contact region.

7. The semiconductor device according to claim 5, wherein a depth of the groove is less than a depth of the source region.

8. A semiconductor device comprising:
a semiconductor layer;
a first conductive type body region disposed in the semiconductor layer;
a second conductive type source region disposed in a surface layer portion of the semiconductor layer so as to be contiguous with the body region;
a groove extending into the source region from a surface thereof;
an insulating film that is laminated on the semiconductor layer to cover a surface of the semiconductor layer;
a contact hole penetrating through the insulating film in a layer thickness direction at least at a position facing the groove;
a wiring disposed on the insulating film;
a contact embedded in the contact hole so that a bottom portion thereof enters the groove to electrically connect the wiring and the source; and
a body contact region penetrating through the source region in the layer thickness direction to be connected to the body region.

9. The semiconductor device according to claim 8, wherein a plurality of the grooves are disposed in the source region.

10. The semiconductor device according to claim 8, wherein a depth of the groove is less than a depth of the source region.

11. The semiconductor device according to claim 8, wherein the groove does not penetrate entirely through the source region.

12. The semiconductor device according to claim 1, wherein a depth of the groove is less than a depth of the source region.

* * * * *